US008396435B2

(12) United States Patent
Nagayama et al.

(10) Patent No.: US 8,396,435 B2
(45) Date of Patent: Mar. 12, 2013

(54) ADDER, AND POWER COMBINER, QUADRATURE MODULATOR, QUADRATURE DEMODULATOR, POWER AMPLIFIER, TRANSMITTER AND WIRELESS COMMUNICATOR USING SAME

(75) Inventors: Akira Nagayama, Tokyo (JP); Yasuhiko Fukuoka, Tokyo (JP)

(73) Assignee: Kyocera Corporation, Kyoto (JP)

( * ) Notice: Subject to any disclaimer, the term of this patent is extended or adjusted under 35 U.S.C. 154(b) by 143 days.

(21) Appl. No.: 13/127,466

(22) PCT Filed: Nov. 5, 2009

(86) PCT No.: PCT/JP2009/068922
§ 371 (c)(1),
(2), (4) Date: May 3, 2011

(87) PCT Pub. No.: WO2010/053134
PCT Pub. Date: May 14, 2010

(65) Prior Publication Data
US 2011/0223871 A1    Sep. 15, 2011

(30) Foreign Application Priority Data
Nov. 5, 2008 (JP) .................................. 2008-284912

(51) Int. Cl.
*H01Q 11/12* (2006.01)
*H04B 1/04* (2006.01)
(52) U.S. Cl. ..................... 455/127.1; 455/118; 455/113
(58) Field of Classification Search .................. 455/73, 455/118, 127.1–127.3, 67.11, 129, 126, 550.1, 455/552.1
See application file for complete search history.

(56) References Cited

U.S. PATENT DOCUMENTS
2010/0240332 A1    9/2010  Nagayama

FOREIGN PATENT DOCUMENTS
| WO | WO-2006/047377 | 5/2006 |
| WO | WO-2008/117399 | 10/2008 |
| WO | WO-2009/041097 | 4/2009 |

OTHER PUBLICATIONS
International Search Report for PCT/JP2009/068922, mailed on Jan. 19, 2010, 4 pages.

*Primary Examiner* — Nay A Maung
*Assistant Examiner* — Cindy Trandai
(74) *Attorney, Agent, or Firm* — Duane Morris LLP

(57) ABSTRACT

To provide an adder capable of obtaining an addition signal of a plurality of high frequency signals, and also a power combiner, a quadrature modulator, a quadrature demodulator, a power amplifier, a transmitter, and a wireless communicator, each of which uses the adder. Impedances (Zg, Zh) seen from a common output point (P3) of a plurality of first impedance circuits (110a, 110b) toward respective input terminals (102a, 102b) are set so that high frequency currents (Ig, Ih) are approximately zero. An impedance (Zs) seen from a first connection point (P1) toward the input terminals (102a, 102b) is set so that a high frequency current (Is) is approximately zero. An impedance (Zc) seen from the first connection point (P1) toward a circuit (150) is set so that a high frequency current (Ic) is approximately zero. An impedance (Zm) seen from a second connection point (P2) toward a power supply is set so that a high frequency current (Im) is approximately zero.

18 Claims, 9 Drawing Sheets

US 8,396,435 B2

ADDER, AND POWER COMBINER, QUADRATURE MODULATOR, QUADRATURE DEMODULATOR, POWER AMPLIFIER, TRANSMITTER AND WIRELESS COMMUNICATOR USING SAME

CROSS REFERENCE TO RELATED APPLICATIONS

This is a U.S. National Phase Application of International Application No. PCT/JP2009/068922 filed Nov. 5, 2009, which claims priority to Japanese Patent Application No. 2008-284912 filed Nov. 5, 2008, the disclosures of which are incorporated herein by reference in their entirety.

TECHNICAL FIELD

The present invention relates to an adder, and a power combiner, a quadrature modulator, a quadrature demodulator, a power amplifier, a transmitter, and a wireless communicator, each of which uses the adder.

BACKGROUND ART

An adder is used for obtaining an addition signal of a plurality of signals. FIG. 14 is a circuit diagram schematically illustrating an example of a conventional adder. In an adder 800 illustrated in FIG. 14, an operational amplifier 802 is virtually grounded to set a potential at a point A to 0 V. Accordingly, when input voltages V1 and V2 are input, a current I1 as expressed by Equation (1) below flows through a resistor Ra and a current I2 as expressed by Equation (2) below flows through a resistor Rb. Further, because input impedance of the operational amplifier 802 is so high that no current flows to the operational amplifier 802, a current If obtained by adding the current I1 and the current I2 as expressed by Equation (3) below flows through a feedback resistor Rf. In this case, the feedback resistor Rf, the current If, and an output voltage Vo of the adder 800 have the relationship of Equation (4) below. Then, from Equations (1) to (3) below, the output voltage Vo is determined by Equation (5) below. For example, if the resistors Ra and Rb and the feedback resistor Rf have the same resistance, the output voltage Vo is determined by Equation (6) below.

$$I1=V1/Ra \qquad (1)$$

$$I2=V2/Rb \qquad (2)$$

$$If=I1+I2 \qquad (3)$$

$$Vo=-Rf*If \qquad (4)$$

$$Vo=-Rf*((V1/Ra)+(V2/Rb)) \qquad (5)$$

$$Vo=-(V1+V2) \qquad (6)$$

DISCLOSURE OF THE INVENTION

Problems to be Solved by the Invention

When the above-mentioned adder 800 is used to obtain an addition signal of a plurality of high frequency signals, it is necessary to set a high gain of the adder 800, and it is therefore necessary to set a resistance value of the feedback resistor Rf to a large value. However, the above-mentioned adder 800 has a maximum operating frequency determined by the product of the resistance value of the feedback resistor Rf and a parasitic capacitance of transistors used in the operational amplifier 802, and hence if the resistance value of the feedback resistor Rf is set high, the maximum operating frequency is reduced. Therefore, the above-mentioned adder 800 cannot obtain an addition signal of a plurality of high frequency signals of, for example, 1 GHz or higher.

The present invention has been made in view of the above-mentioned problem, and it is an object thereof to provide an adder capable of obtaining an addition signal of a plurality of high frequency signals, and also provide a power combiner, a quadrature modulator, a quadrature demodulator, a power amplifier, a transmitter, and a wireless communicator, each of which uses the adder.

Means for Solving the Problems

In order to solve the above-mentioned problem, an adder according to the present invention includes: a plurality of input terminals; an output terminal; a plurality of first impedance circuits connected in parallel, each including one end connected to corresponding one of the plurality of input terminals and the other end connected to a common output; a second impedance circuit including one end configured to connect to a power supply; a transistor circuit including a drain terminal connected to the other end of the second impedance circuit; and a third impedance circuit including one end connected to a source terminal of the transistor circuit and the other end connected to a circuit through which a substantially constant current flows, in which: the plurality of first impedance circuits have a common output point which is directly or indirectly connected to a first connection point on a line between the source terminal of the transistor circuit and the one end of the third impedance circuit; the output terminal is directly or indirectly connected to a second connection point on a line between the other end of the second impedance circuit and the drain terminal of the transistor circuit; impedances seen from the common output point of the plurality of first impedance circuits toward the respective plurality of input terminals are set so that high frequency currents flowing from the common output point of the plurality of first impedance circuits toward the respective plurality of input terminals are approximately zero; an impedance seen from the first connection point toward the plurality of input terminals is set so that a high frequency current flowing from the first connection point toward the plurality of input terminals is approximately zero; an impedance seen from the first connection point toward the circuit through which the substantially constant current flows is set so that a high frequency current flowing from the first connection point toward the circuit through which the substantially constant current flows is approximately zero; and an impedance seen from the second connection point toward the power supply is set so that a high frequency current flowing from the second connection point toward the power supply is approximately zero.

Further, an adder according to the present invention includes: a plurality of input terminals; an output terminal; a plurality of first impedance circuits connected in parallel, each including one end connected to corresponding one of the plurality of input terminals and the other end connected to a common output; a second impedance circuit including one end configured to connect to a power supply; a transistor circuit including a drain terminal connected to the other end of the second impedance circuit; and a third impedance circuit including one end connected to a source terminal of the transistor circuit and the other end connected to a circuit through which a substantially constant current flows, in which: the plurality of first impedance circuits have a common output point which is directly or indirectly connected to a first connection point on a line between the source terminal of the transistor circuit and the one end of the third impedance circuit; the output terminal is directly or indirectly connected to a second connection point on a line between the other end of the second impedance circuit and the drain terminal of the transistor circuit; and impedances seen from the common output point of the plurality of first impedance circuits toward the respective plurality of input terminals, an impedance seen from the first connection point toward the plurality of input terminals, an impedance seen from the first connection point toward the circuit through which the substantially constant current flows, and an impedance seen from the second connection point toward the power supply are set so that an output signal output from the output terminal is within tolerance.

Further, according to an aspect of the present invention: the adder may further include a first output terminal and a second output terminal; the first output terminal may be directly or indirectly connected to the second connection point; the second output terminal may be directly or indirectly connected to the first connection point; and a gate width of the transistor circuit and the impedance seen from the second connection point toward the power supply may be set so that a first output signal from the first output terminal and a second output signal from the second output terminal have a phase difference of substantially $\pi/2$.

In this aspect, the second connection point and the drain terminal of the transistor circuit may be connected via a filter circuit; and the gate width of the transistor circuit, the impedance seen from the second connection point toward the power supply, and the filter circuit may be set so that the first output signal and the second output signal have the phase difference of substantially $\pi/2$.

Further, a power combiner according to the present invention includes: two power amplifiers for amplifying and outputting input signals; and the above-mentioned adder for adding output signals of the two power amplifiers, which are input to the adder, and outputting an added signal.

Further, a quadrature modulator according to the present invention includes: a first voltage-controlled oscillator for receiving an I signal to output a first output signal represented by $\cos((\omega c+\omega s)*t)$, and a second voltage-controlled oscillator for receiving the I signal to output a second output signal represented by $\cos((\omega c-\omega s)*t)$, where $\omega c$ is an angular frequency of a carrier wave and $\omega s$ is an angular frequency of a modulated signal which varies based on a level of the I signal; a third voltage-controlled oscillator for receiving a Q signal to output a third output signal represented by $\cos((\omega c+\omega s)*t)$, and a fourth voltage-controlled oscillator for receiving the Q signal to output a fourth output signal represented by $\cos((\omega c-\omega s)*t)$, where $\omega c$ is an angular frequency of a carrier wave and $\omega s$ is an angular frequency of a modulated signal which varies based on a level of the Q signal; the first adder according to claim 1 or 2 for adding the first output signal and the second output signal which are input to the first adder, and outputting a fifth output signal; the second adder according to claim 1 or 2 for adding the third output signal and the fourth output signal which are input to the second adder, and outputting a sixth output signal; and the above-mentioned adder for adding the fifth output signal and the sixth output signal which are input to the adder, and outputting a seventh output signal.

Further, a quadrature demodulator according to the present invention includes the above-mentioned adder, in which the quadrature demodulator performs quadrature demodulation by the adder adding a plurality of signals.

Further, a power amplifier according to the present invention includes: a constant envelope signal generation circuit for converting an input signal with envelope variation into a first constant envelope signal and a second constant envelope signal, to output the first constant envelope signal and the second constant envelope signal; a first amplifier for amplifying the first constant envelope signal which is input to the first amplifier, and outputting a first amplified signal; a second amplifier for amplifying the second constant envelope signal which is input to the second amplifier, and outputting a second amplified signal; and the above-mentioned adder for adding the first amplified signal and the second amplified signal which are input to the adder, and outputting an amplified output signal with envelop variation.

Further, a transmitter according to the present invention includes: a transmission circuit; an antenna; and the power amplifier described above, in which the antenna is connected to the transmission circuit via the power amplifier.

Further, a wireless communicator according to the present invention includes: a transmission circuit; a reception circuit; an antenna; and the power amplifier described above, in which the antenna is connected to the transmission circuit via the power amplifier, and the reception circuit is connected to the antenna.

Effect of the Invention

According to the adder of the present invention, the addition signal of the plurality of high frequency signals can be obtained.

BEST MODE FOR CARRYING OUT THE INVENTION

Figure 1:
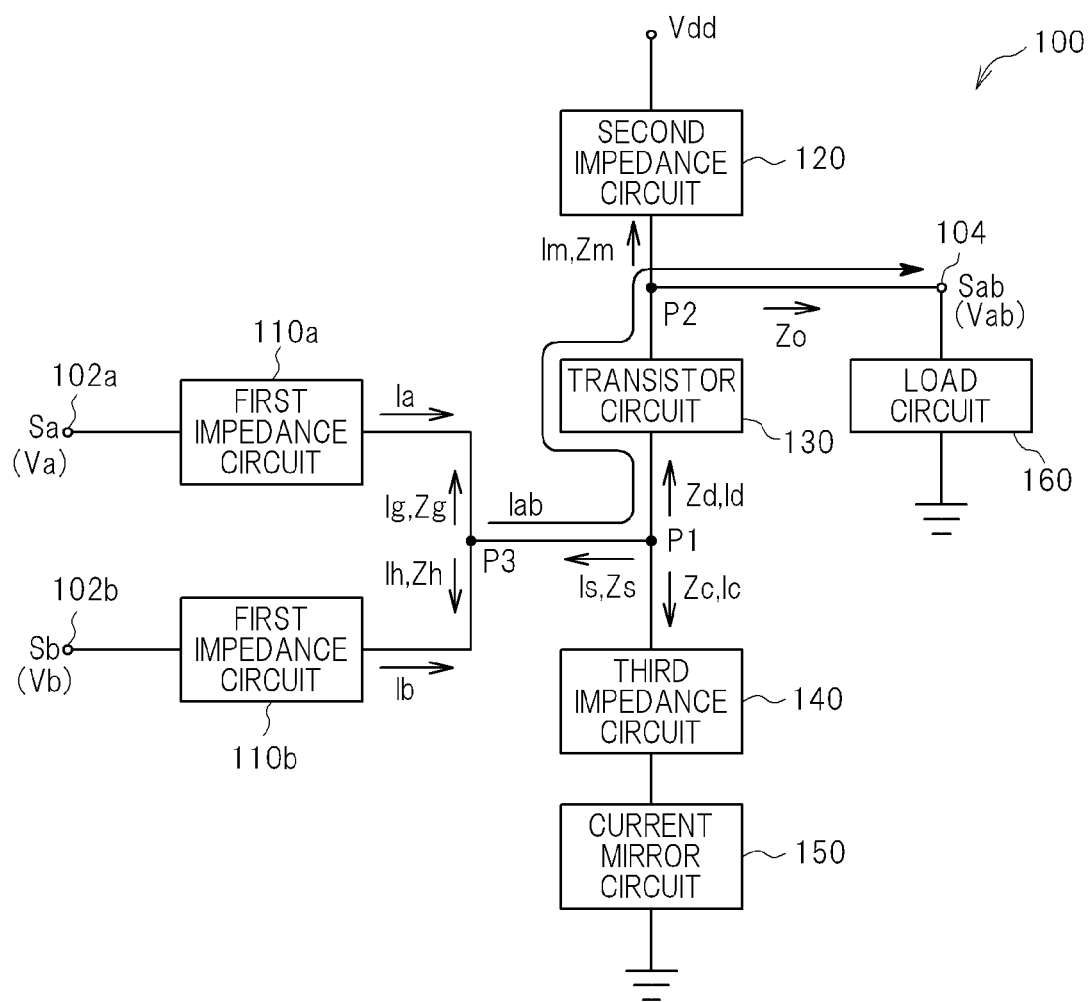
[FIG. 1] A block diagram schematically illustrating an example of an adder according to a first embodiment.

Referring to the drawings, exemplary embodiments of the present invention are described in detail below.

[First Embodiment]

Figure 2:
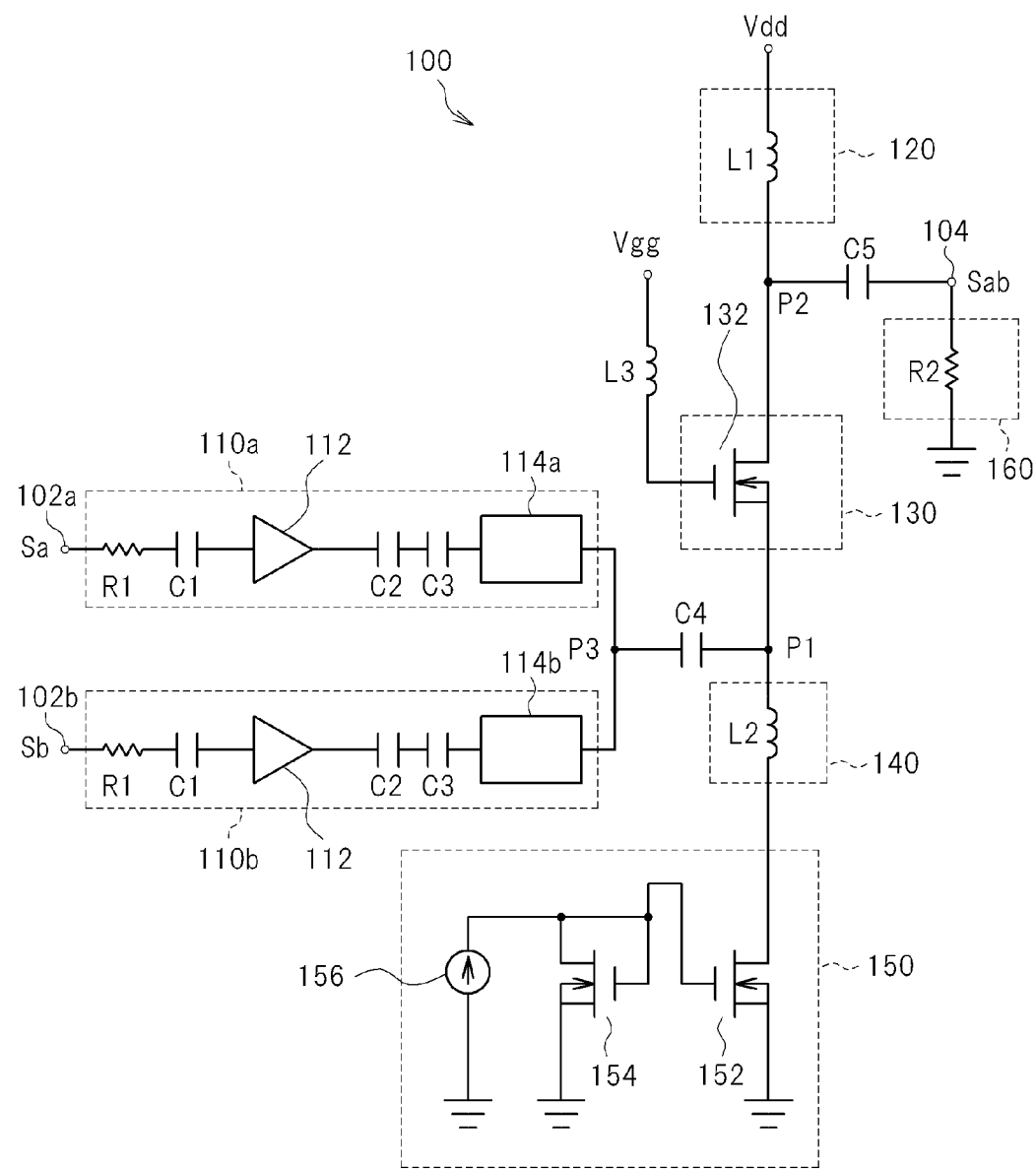
[FIG. 2] A circuit diagram schematically illustrating the example of the adder according to the first embodiment.

FIG. 1 is a block diagram schematically illustrating an example of an adder according to a first embodiment of the present invention. FIG. 2 is a circuit diagram schematically illustrating the example of the adder according to the first embodiment. As illustrated in FIG. 1, an adder 100 according to the first embodiment includes a plurality of first impedance circuits 110a and 110b, a second impedance circuit 120, a transistor circuit 130, a third impedance circuit 140, a current mirror circuit 150, and a load circuit 160.

The first impedance circuits 110a and 110b have one ends directly or indirectly connected to input terminals 102a and 102b, respectively. In other words, the one end of the first impedance circuit 110a is connected to the input terminal 102a, and an input signal Sa (voltage Va) as a high frequency signal is input to the first impedance circuit 110a. Similarly, the one end of the first impedance circuit 110b is connected to the input terminal 102b, and an input signal Sb (voltage Vb) as a high frequency signal is input to the first impedance circuit 110b. The first impedance circuits 110a and 110b have the other ends directly or indirectly connected to each other to provide a common output, and the first impedance circuits 110a and 110b are connected in parallel. A current Ia (high frequency current) corresponding to the input signal Sa (voltage Va) flows through the first impedance circuit 110a, and a current Ib (high frequency current) corresponding to the input signal Sb (voltage Vb) flows through the first impedance circuit 110b. A current Iab (high frequency current) combining the current Ia and the current Ib is output from a common output point P3 of the first impedance circuits 110a and 110b.

The first impedance circuits 110a and 110b each include, for example, a buffer amplifier 112 (see FIG. 2). The buffer amplifier 112 has a high output impedance to prevent reflection of the input signal Sa or Sb to the input side of the buffer amplifier 112. In the example illustrated in FIG. 2, the input side of the buffer amplifier 112 is connected to the input terminal 102a or 102b via a resistor R1 and a capacitor C1. Further, the output side of the buffer amplifier 112 is connected to a matching circuit 114a or 114b via capacitors C2 and C3. The capacitors C1, C2, and C3 are provided for removing a DC component. The output sides of the matching circuits 114a and 114b are connected to each other. In other words, the other ends of the buffer amplifiers 112 are connected to each other via the matching circuits 114a and 114b.

The common output point P3 of the first impedance circuits 110a and 110b is directly or indirectly connected to a first connection point P1 on a line between the transistor circuit 130 and the third impedance circuit 140. In other words, the common output point P3 of the first impedance circuits 110a and 110b is directly or indirectly connected to both the transistor circuit 130 and the third impedance circuit 140. In the example illustrated in FIG. 2, the common output point P3 of the first impedance circuits 110a and 110b is connected to the first connection point P1 via a capacitor C4. In other words, the common output point P3 of the first impedance circuits 110a and 110b is connected to both the transistor circuit 130 and the third impedance circuit 140 via the capacitor C4. The capacitor C4 is provided for removing a DC component. Note that, the common output point P3 of the first impedance circuits 110a and 110b may be connected directly to the first connection point P1. Further, the common output point P3 of the first impedance circuits 110a and 110b and the first connection point P1 may be the same point.

Impedances Zg and Zh seen from the common output point P3 of the plurality of first impedance circuits 110a and 110b toward the respective input terminals 102a and 102b are set so that high frequency currents Ig and Ih, which flow from the common output point P3 toward the respective input terminals 102a and 102b, may be much smaller than the current Iab. In other words, the impedances Zg and Zh are set so that the above-mentioned high frequency currents Ig and Ih may be approximately zero. Note that, the matching circuits 114a and 114b operate to increase the impedances Zg and Zh. However, the matching circuits 114a and 114b are not essential components. If the impedances Zg and Zh are set by the buffer amplifiers 112 so that the above-mentioned high frequency currents Ig and Ih may be approximately zero, the matching circuits 114a and 114b may be omitted.

An impedance Zs seen from the first connection point P1 toward the input terminals 102a and 102b is set much higher than an impedance seen from the input terminals 102a and 102b toward the first connection point P1. More specifically, the impedance Zs is set so that a high frequency current Is flowing from the first connection point P1 toward the input terminals 102a and 102b may be much smaller than the current Iab. In other words, the impedance Zs is set so that the above-mentioned high frequency current Is may be approximately zero. Note that, the impedance Zs is adjusted by, for example, adjustment to the line length from the buffer amplifiers 112 to the first connection point P1 or adjustment to the matching circuits 114a and 114b.

The second impedance circuit 120 has one end applied with a power supply voltage Vdd and the other end directly or indirectly connected to both an output terminal 104 and the transistor circuit 130. The second impedance circuit 120 includes, for example, an inductor L1 (see FIG. 2).

The output terminal 104 is directly or indirectly connected to a second connection point P2 on a line between the second impedance circuit 120 and the transistor circuit 130. In the example illustrated in FIG. 2, the output terminal 104 is connected to the second connection point P2 via a capacitor C5.

An impedance Zm seen from the second connection point P2 toward the power supply is set very high. More specifically, the impedance Zm is set so that a high frequency current Im flowing from the second connection point P2 toward the power supply may be much smaller than the current Iab. In other words, the impedance Zm is set so that the above-mentioned high frequency current Im may be approximately zero.

The load circuit 160 has one end grounded and the other end connected to the output terminal 104. The load circuit 160 includes, for example, a resistor R2 (see FIG. 2).

As illustrated in FIG. 2, the transistor circuit 130 includes a transistor 132. The transistor 132 has a drain terminal directly or indirectly connected to both the second impedance circuit 120 and the output terminal 104 (load circuit 160), and a source terminal directly or indirectly connected to both the common output point P3 of the first impedance circuits 110a and 110b and the third impedance circuit 140. Further, the transistor 132 has a gate terminal applied with a gate voltage Vgg via an inductor L3. The gate width of the transistor 132 is set large so as to extremely reduce an impedance Zd seen from the first connection point P1 toward the load circuit 160. In other words, the gate width is set so that the impedance Zd may be approximately zero, and hence a high frequency current Id easily flows from the first connection point P1 toward the load circuit 160.

The third impedance circuit 140 has one end directly or indirectly connected to both the common output point P3 of the first impedance circuits 110a and 110b and the transistor circuit 130, and the other end connected to the current mirror circuit 150. The third impedance circuit 140 includes, for example, an inductor L2 (see FIG. 2).

The current mirror circuit 150 has one end connected to the third impedance circuit 140 and the other end grounded. The current mirror circuit 150 is a commonly-used current mirror circuit including transistors 152 and 154 and a constant current source 156 (see FIG. 2). The current mirror circuit 150 is set so as to supply a substantially constant DC current.

An impedance Zc seen from the first connection point P1 toward the current mirror circuit 150 is set much higher than an impedance seen from the current mirror circuit 150 toward the first connection point P1. More specifically, the impedance Zc is set so that a high frequency current Ic flowing from the first connection point P1 toward the current mirror circuit 150 may be much smaller than the current Iab. In other words, the impedance Zc is set so that the above-mentioned high frequency current Ic may be approximately zero. When the above-mentioned high frequency current Ic is approximately zero, the above-mentioned high frequency current Id is substantially equal to the current Iab. Note that, the flow of the substantially constant DC current in the current mirror circuit 150 maintains a substantially constant potential of the first connection point P1.

In the adder 100, the impedances Zg and Zh are set as described above, and hence the current Iab (high frequency current) combining the current Ia and the current Ib is output from the common output point P3 and then input to the first connection point P1. Further, the impedances Zs, Zc, Zd, and Zm are set as described above, and hence, as illustrated in FIG. 1, the current Iab is input to the load circuit 160. As a result, a voltage Vab corresponding to the current Iab is output from the output terminal 104 as an output signal Sab. In other words, the output signal Sab obtained by vector addition of the input signals Sa and Sb is output from the output terminal 104.

Figure 3:
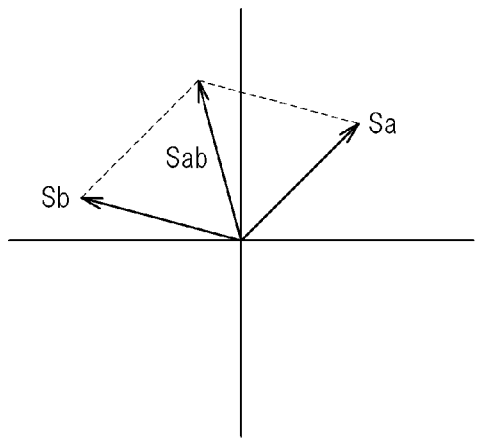
[FIG. 3] A vector diagram illustrating a simulation result.

In order to confirm the operation of the adder 100, a simulation was carried out under the following conditions.
(1) Frequency of input signals Sa and Sb: 2.5 GHz
(2) Power supply voltage Vdd: 20.0 V
(3) Gate voltage Vgg: 20.0 V
(4) Resistor R1: 10.0 mΩ
(5) Resistor R2: 50Ω
(6) Capacitors C1, C2, C4, and C5: 10.0 μF
(7) Capacitor C3: 1.0 μF
(8) Inductors L1 and L2: 1.0 nH
(9) Constant current source 156: 0.5 mA FIG. 3 is a vector diagram illustrating a simulation result, in which the relationship between the input signals Sa and Sb and the output signal Sab is represented by vectors. As illustrated in FIG. 3, it was able to obtain the output signal Sab obtained by vector addition of the input signals Sa and Sb as high frequency signals.

Figure 14:
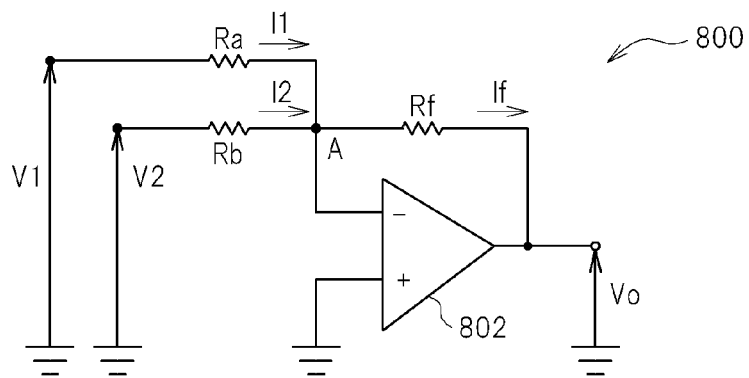
[FIG. 14] A circuit diagram schematically illustrating an example of a conventional adder.

As described above, the adder 100 according to the first embodiment can obtain a signal obtained by vector addition of a plurality of high frequency signals. The adder 100 has no feedback resistor Rf included in the adder 800 illustrated in FIG. 14, and therefore the maximum operating frequency is not limited to be capable of obtaining the signal obtained by vector addition of the plurality of high frequency signals.

If (1) the high frequency currents Ig and Ih flowing from the common output point P3 of the first impedance circuits 110a and 110b toward the respective input terminals 102a and 102b; (2) the high frequency current Is flowing from the first connection point P1 toward the input terminals 102a and 102b; (3) the high frequency current Ic flowing from the first connection point P1 toward the current mirror circuit 150; or (4) the high frequency current Im flowing from the second connection point P2 toward the power supply becomes large, a high frequency current to be actually input to the output terminal 104 (load circuit 160) differs largely from the current Iab combining the current Ia and the current Ib. As a result, the output signal Sab has a large error. In this point, in the adder 100, the impedances Zg, Zh, Zs, Zc, and Zm are set so that the high frequency currents Ig, Ih, Is, Ic, and Im may be much smaller than the current Iab (i.e., so that the high frequency currents Ig, Ih, Is, Ic, and Im may be suppressed to approximately zero). Therefore, the error of the output signal Sab can be suppressed to an allowable error or less. In other words, in the adder 100, the impedances Zg, Zh, Zs, Zc, and Zm are set so that the error of the output signal Sab may be an allowable error or less.

By the way, the phrase "the high frequency currents Ig, Ih, Is, Ic, and Im may be approximately zero" includes a state in which absolutely no high frequency currents Ig, Ih, Is, Ic, and Im are flowing, that is, those currents are completely zero, and also includes the following state. That is, the phrase also includes a state in which, as compared to the current Iab, the high frequency currents Ig, Ih, Is, Ic, and Im are minute enough to neglect the error of the output signal Sab caused by the flow of the high frequency currents Ig, Ih, Is, Ic, and Im. In other words, the phrase also includes a state in which the high frequency currents Ig, Ih, Is, Ic, and Im are much smaller than the current Iab such that the error of the output signal Sab does not exceed an allowable error.

Note that, an example of the case where the high frequency currents Ig, Ih, Is, Ic, and Im are much smaller than the current Iab is a case where the high frequency currents Ig, Ih, Is, Ic, and Im are 1/1,000 or less of the current Iab. For example, the relationships between the high frequency currents Is, Ic, and Im and the current Iab (or the high frequency current Id) are expressed by Equations (7) to (9) below. Note that, in Equation (7) below, a coefficient Kc is a generation coefficient of an undesired wave on the input side of the current mirror circuit 150, and a coefficient Kd is a generation coefficient of an undesired wave on the input side of the load circuit 160. Further, in Equation (9) below, Zo is the impedance seen from the second connection point P2 toward the output terminal 104 as illustrated in FIG. 1.

$$Is = ((Kd^*Zc + Kc^*Zd)/(Zd + Zc))^*Iab \qquad (7)$$

$$Ic = (Zd/(Zd + Zc))^*Iab \qquad (8)$$

$$Im = (Zo/(Zo + Zm))^*Id \qquad (9)$$

For example, in order that the high frequency current Is be 1/1,000 or less of the current Iab, the impedances Zc and Zd should be set so that $((Kd^*Zc + Kc^*Zd)/(Zc + Zd))$ in Equation (7) above may be 1/1,000 or less. As another example, in order that the high frequency current Ic be 1/1,000 or less of the current Iab, the impedances Zc and Zd should be set so that $(Zd/(Zd + Zc))$ in Equation (8) above may be 1/1,000 or less. As a further example, in order that the high frequency current Im be 1/1,000 or less of the high frequency current Id (current Iab), the impedances Zo and Zm should be set so that $(Zo/(Zo + Zm))$ in Equation (9) above may be 1/1,000 or less.

Note that, in the first impedance circuit 110a or 110b, the buffer amplifier 112 maybe replaced with, for example, an isolator or a resistor as long as the input signal Sa or Sb is not reflected to the input side.

Further, in the second impedance circuit 120, the inductor L1 may be replaced with another element as long as the impedance Zm seen from the second connection point P2 toward the power supply can be set very high so that the high frequency current Im flowing from the second connection point P2 toward the power supply can be minute as compared to the current Iab (i.e., so that the high frequency current Im can be approximately zero).

Further, in the third impedance circuit 140, the inductor L2 may be replaced with another element as long as the impedance Zc seen from the first connection point P1 toward the current mirror circuit 150 can be set very high so that the high frequency current Ic flowing from the first connection point P1 toward the current mirror circuit 150 can be minute as compared to the current Iab (i.e., so that the high frequency current Ic can be approximately zero). For example, the inductor L2 may be replaced with a transistor. In this case, the transistor circuit 130 is connected to a drain terminal of the transistor, and the current mirror circuit 150 is connected to a source terminal thereof. In addition, the transistor is set so as to supply a substantially constant current.

Still further, instead of connecting the resistor R2, an inductor may be connected to the output terminal 104 so as to output the voltage Vab corresponding to the current Iab from the output terminal 104 as the output signal Sab.

[Second Embodiment]

Figure 4:
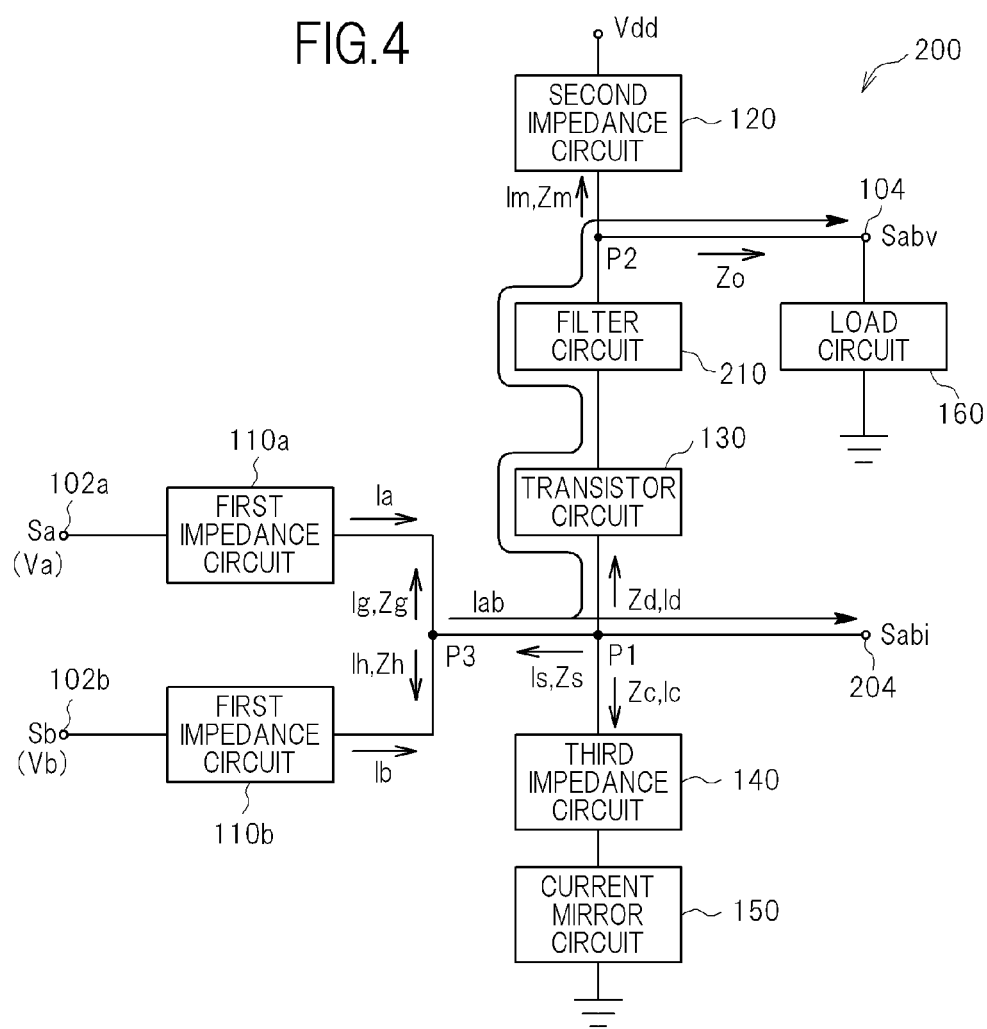
[FIG. 4] A block diagram schematically illustrating an example of an adder according to a second embodiment.
Figure 5:
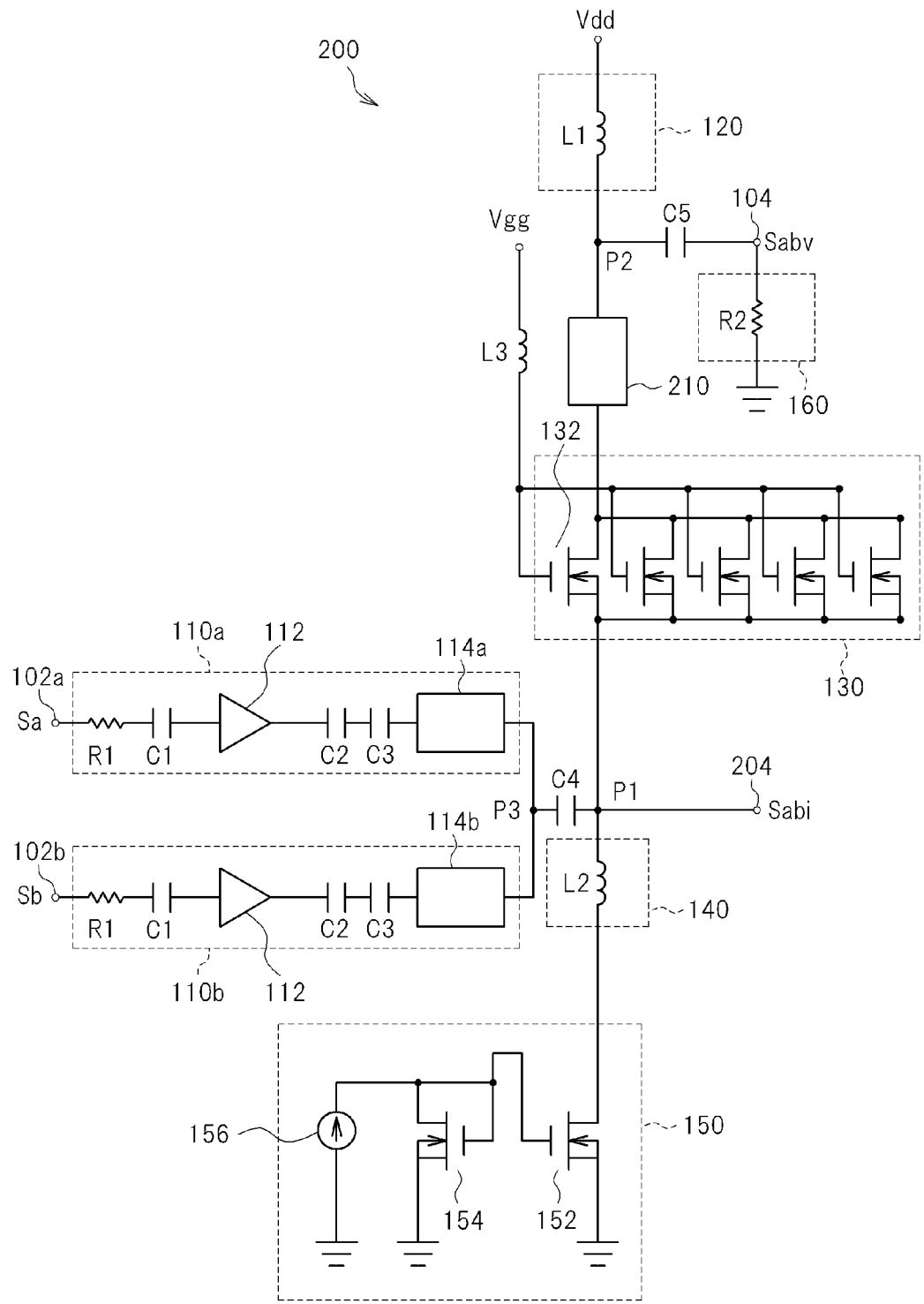
[FIG. 5] A circuit diagram schematically illustrating the example of the adder according to the second embodiment.

FIG. 4 is a block diagram schematically illustrating an example of an adder according to a second embodiment of the present invention. FIG. 5 is a circuit diagram schematically illustrating the example of the adder according to the second embodiment. Note that, in FIGS. 4 and 5, the same components as those in the first embodiment are denoted by the same reference symbols, and description of the components is omitted.

As illustrated in FIG. 4, an adder 200 according to the second embodiment includes the plurality of first impedance circuits 110a and 110b, the second impedance circuit 120, the transistor circuit 130, the third impedance circuit 140, the current mirror circuit 150, the load circuit 160, and a filter circuit 210.

The filter circuit 210 has one end directly or indirectly connected to both the second impedance circuit 120 and the output terminal 104 (load circuit 160), and the other end connected to the transistor circuit 130. The filter circuit 210 is a commonly-used LC filter, and functions as a phase shift filter. The filter circuit 210 serves for impedance matching.

In the adder 200, in addition to the output terminal 104 (first output terminal), an output terminal 204 (second output terminal) connected to the first connection point P1 is provided. A current corresponding to the current Iab (high frequency current) is output from the output terminal 204 as an output signal Sabi. Particularly in the adder 200, an output signal Sabv (first output signal), which is a voltage signal output from the output terminal 104, and the output signal Sabi (second output signal), which is a current signal output from the output terminal 204, are set to have a phase difference of substantially $\pi/2$.

The phase difference between the output signal Sabv and the output signal Sabi is affected by the value of the inductor L1 (impedance Zm), the value of the capacitor C5, the gate width of the transistor circuit 130, and the constant of the filter circuit 210. Therefore, through adjustment to the value of the inductor L1 (impedance Zm), the value of the capacitor C5, the gate width of the transistor circuit 130, or the constant of the filter circuit 210, the phase difference between the output signal Sabv and the output signal Sabi is set to substantially $\pi/2$.

For example, as the value of the inductor L1 is larger, the phase difference between the output signal Sabv and the output signal Sabi becomes larger to approximate $\pi/2$. As another example, as the gate width of the transistor circuit 130 is larger, the phase difference between the output signal Sabv and the output signal Sabi becomes larger to approximate $\pi/2$.

In the adder 200, in order to increase the gate width of the transistor circuit 130, the transistor circuit 130 includes a plurality of parallel-connected transistors 132 (see FIG. 5). Further, in the adder 200, the filter circuit 210 is provided for adjusting the phase difference between the output signal Sabv and the output signal Sabi to substantially $\pi/2$.

Note that, even if the filter circuit 210 is not provided, it is possible to adjust the phase difference between the output signal Sabv and the output signal Sabi to substantially $\pi/2$. However, when the filter circuit 210 is not provided, the value of the inductor L1 or the gate width of the transistor circuit 130 needs to be increased in order to set the phase difference between the output signal Sabv and the output signal Sabi to substantially $\pi/2$. In this point, the provision of the filter circuit 210 enables the phase difference between the output signal Sabv and the output signal Sabi to be set to substantially $\pi/2$ without increasing the value of the inductor L1 or the gate width of the transistor circuit 130 so much.

As described above, the adder 200 according to the second embodiment can obtain both (1) a current signal (output signal Sabi) corresponding to a signal obtained by vector addition of a plurality of high frequency signals and (2) a voltage signal (output signal Sabv) corresponding to a signal obtained by vector addition of the plurality of high frequency signals and having a phase difference of substantially $\pi/2$ from the above-mentioned current signal (output signal Sabi).

[Third Embodiment]

Figure 6:
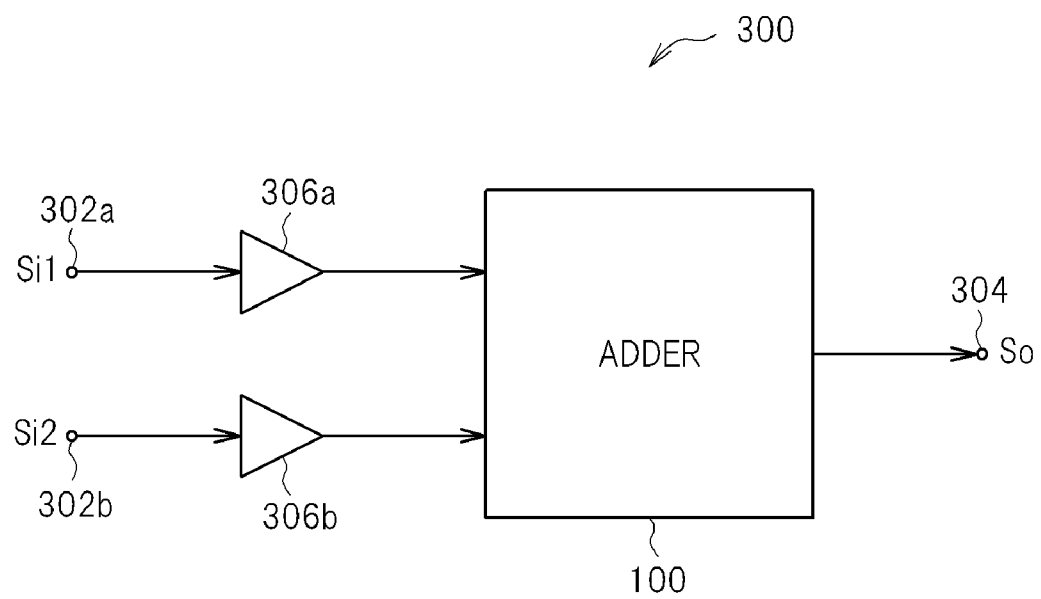
[FIG. 6] A block diagram schematically illustrating an example of a power combiner according to a third embodiment.

The adder 100 according to the first embodiment can be used for a power combiner. By using the adder 100 according to the first embodiment, it is possible to implement a power combiner that performs power combining by vector addition of a plurality of high frequency signals. FIG. 6 is a block diagram schematically illustrating an example of using the adder 100 according to the first embodiment to constitute a power combiner.

A power combiner 300 illustrated in FIG. 6 includes two power amplifiers 306a and 306b and the adder 100. In the power combiner 300, input terminals 302a and 302b are connected to the power amplifiers 306a and 306b, respectively, and input signals Si1 and Si2 as high frequency signals are input to the power amplifiers 306a and 306b, respectively. The input signals Si1 and Si2 amplified by the power amplifiers 306a and 306b are input to the adder 100. Then, a signal obtained by vector addition of the amplified input signals Si1 and Si2 is output from the adder 100, which is then output from an output terminal 304 as an output signal So.

According to the power combiner 300 of the third embodiment, a power combiner that performs power combining by vector addition of a plurality of high frequency signals is implemented.

[Fourth Embodiment]

Figure 7:
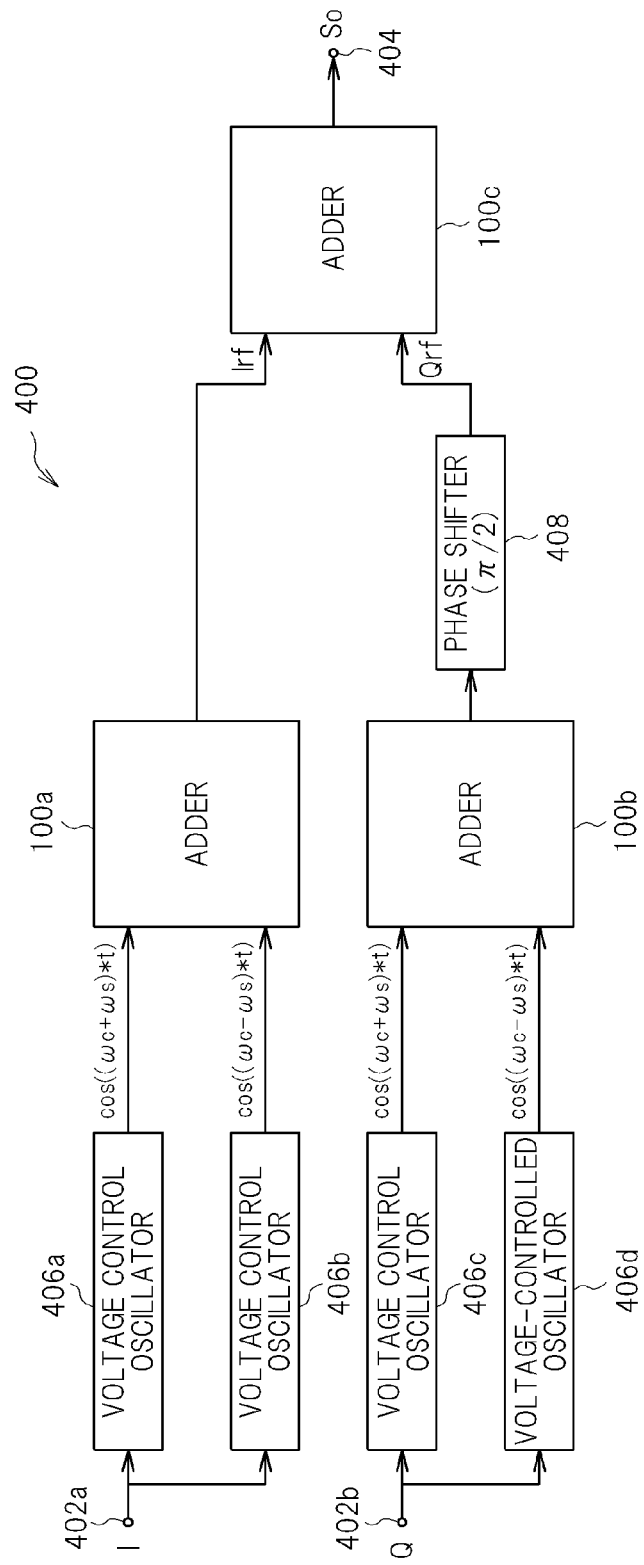
[FIG. 7] A block diagram schematically illustrating an example of a quadrature modulator according to a fourth embodiment.

The adder 100 according to the first embodiment can be used for a quadrature modulator. By using the adder 100 according to the first embodiment, it is possible to implement a quadrature modulator that performs quadrature modulation by vector addition of a plurality of high frequency signals. FIG. 7 is a block diagram schematically illustrating an example of using the adder 100 according to the first embodiment to constitute a quadrature modulator.

A quadrature modulator 400 according to a fourth embodiment includes voltage-controlled oscillators 406a, 406b, 406c, and 406d, adders 100a, 100b, and 100c, and a phase shifter 408. The adders 100a, 100b, and 100c are the adder 100 according to the first embodiment.

An input terminal 402a is connected in common to the voltage-controlled oscillators 406a and 406b, and an I signal is input to the voltage-controlled oscillators 406a and 406b. Then, for example, a signal represented by $\cos((\omega c+\omega s)*t)$ is output from the voltage-controlled oscillator 406a, and, for example, a signal represented by $\cos((\omega c-\omega s)*t)$ is output from the voltage-controlled oscillator 406b. Note that, $\omega c$ is an angular frequency of a carrier wave. On the other hand, $\omega s$ is an angular frequency of a modulated signal, and the value of $\omega s$ varies based on the level of the I signal.

The output signals of the voltage-controlled oscillators 406a and 406b are input to the adder 100a, and a signal Irf obtained by vector addition of those signals is output from the adder 100a, which is then input to the adder 100c.

Further, an input terminal 402b is connected in common to the voltage-controlled oscillators 406c and 406d, and a Q signal is input to the voltage-controlled oscillators 406c and 406d. Then, for example, a signal represented by $\cos((\omega c+\omega s)*t)$ is output from the voltage-controlled oscillator 406c, and, for example, a signal represented by $\cos((\omega c-\omega s)*t)$ is output from the voltage-controlled oscillator 406d. Note that, $\omega c$ is an angular frequency of a carrier wave. On the other hand, $\omega s$ is an angular frequency of a modulated signal, and the value of $\omega s$ varies based on the level of the Q signal.

The output signals of the voltage-controlled oscillators 406c and 406d are input to the adder 100b, and a signal obtained by vector addition of those signals is output from the adder 100b. The signal output from the adder 100b is input to the phase shifter 408 to be advanced in phase by $\pi/2$. Then, a signal Qrf output from the phase shifter 408 is input to the adder 100c.

In the adder 100c, vector addition of the signal Irf and the signal Qrf is performed, and a signal obtained by the vector addition of the signal Irf and the signal Qrf is output from an output terminal 404 as an output signal So.

According to the quadrature modulator 400 of the fourth embodiment, a quadrature modulator that performs quadrature modulation by vector addition of a plurality of high frequency signals is implemented.

Note that, similarly to the quadrature modulator, the adder 100 according to the first embodiment can also be used for a quadrature demodulator. By using the adder 100 according to the first embodiment, it is possible to implement a quadrature demodulator that performs quadrature demodulation by vector addition of a plurality of high frequency signals.

[Fifth Embodiment]

Figure 8:
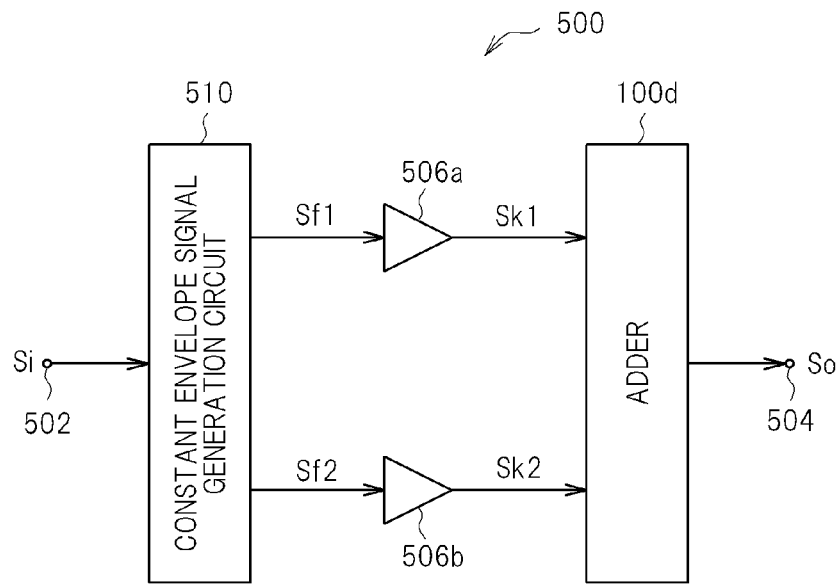
[FIG. 8] A block diagram schematically illustrating an example of a power amplifier according to a fifth embodiment.
Figure 9:
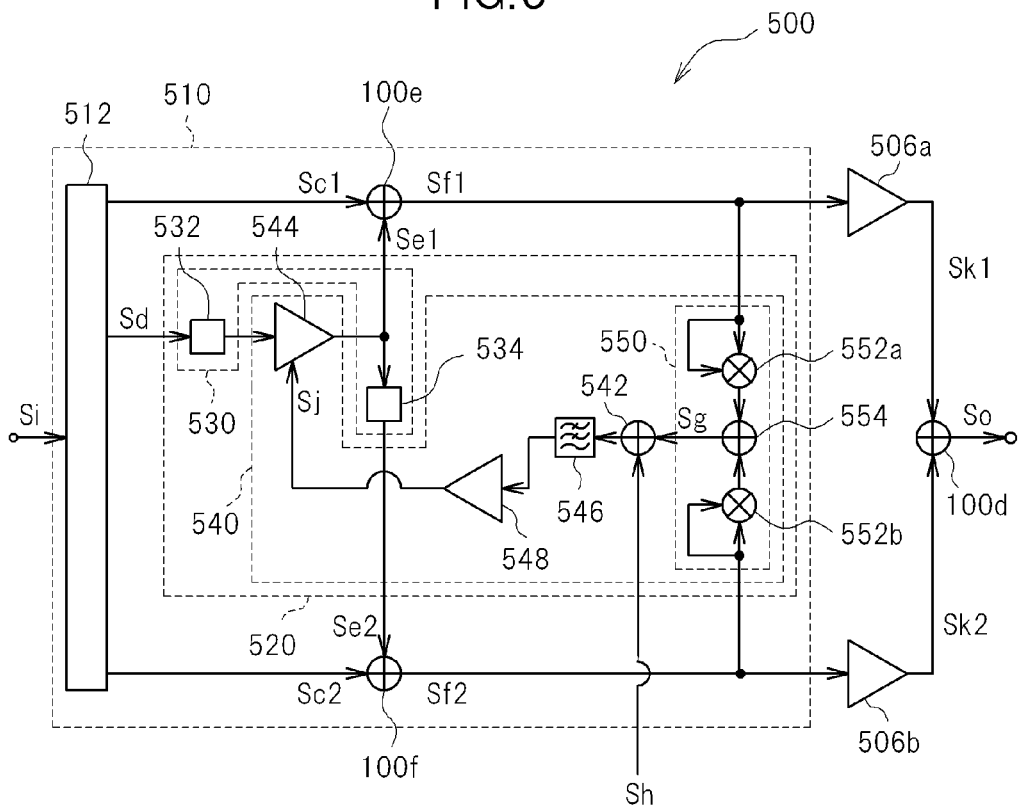
[FIG. 9] A circuit diagram schematically illustrating the example of the power amplifier according to the fifth embodiment.

The adder 100 according to the first embodiment can be used for a power amplifier. By using the adder 100 according to the first embodiment, it is possible to implement a power amplifier that performs power amplification by vector addition of a plurality of high frequency signals. FIG. 8 is a block diagram schematically illustrating an example of using the adder 100 according to the first embodiment to constitute a power amplifier. FIG. 9 is a circuit diagram schematically illustrating the example of using the adder 100 according to the first embodiment to constitute a power amplifier. Note that, adders 100d, 100e, and 100f are the adder 100 according to the first embodiment.

As illustrated in FIG. 8, a power amplifier 500 according to a fifth embodiment includes a constant envelope signal generation circuit 510, amplifiers 506a and 506b, and the adder 100d. To the power amplifier 500, an input signal Si with envelope variation is input from an input terminal 502. The constant envelope signal generation circuit 510 converts the input signal Si into constant envelope signals Sf1 and Sf2 which have the same amplitude but different phases. The amplifier 506a amplifies the constant envelope signal Sf1, and the amplifier 506b amplifies the constant envelope signal Sf2. The adder 100d performs vector addition of an amplified signal Sk1 output from the amplifier 506a and an amplified signal Sk2 output from the amplifier 506b, to thereby output an amplified output signal So with envelope variation. The output signal So is output from an output terminal 504.

As illustrated in FIG. 9, the constant envelope signal generation circuit 510 includes a power distributor 512, a converted signal generation circuit 520, and the adders 100e and 100f. In the constant envelope signal generation circuit 510, the power distributor 512 generates, from the input signal Si, fundamental signals Sc1 and Sc2 having the same amplitude and a predetermined phase relationship with the input signal Si, and a conversion fundamental signal Sd having a constant phase relationship with the fundamental signals Sc1 and Sc2.

The converted signal generation circuit 520 generates a converted signal Se1 and a converted signal Se2 based on the conversion fundamental signal Sd. The converted signal Se1 has an amplitude Y satisfying $Y^2=A^2-X^2$ (X: amplitude of fundamental signal Sc1, Sc2, A: any constant amplitude larger than X), and is advanced in phase by $\pi/2$ relative to the fundamental signal Sc1. The converted signal Se2 has the amplitude Y and is delayed in phase by $\pi/2$ relative to the fundamental signal Sc2.

The adder 100e performs vector addition of the fundamental signal Sc1 and the converted signal Se1. The adder 100f performs vector addition of the fundamental signal Sc2 and the converted signal Se2. An output signal from the adder 100e is output as the constant envelope signal Sf1, and an output signal from the adder 100f is output as the constant envelope signal Sf2.

Figure 10:
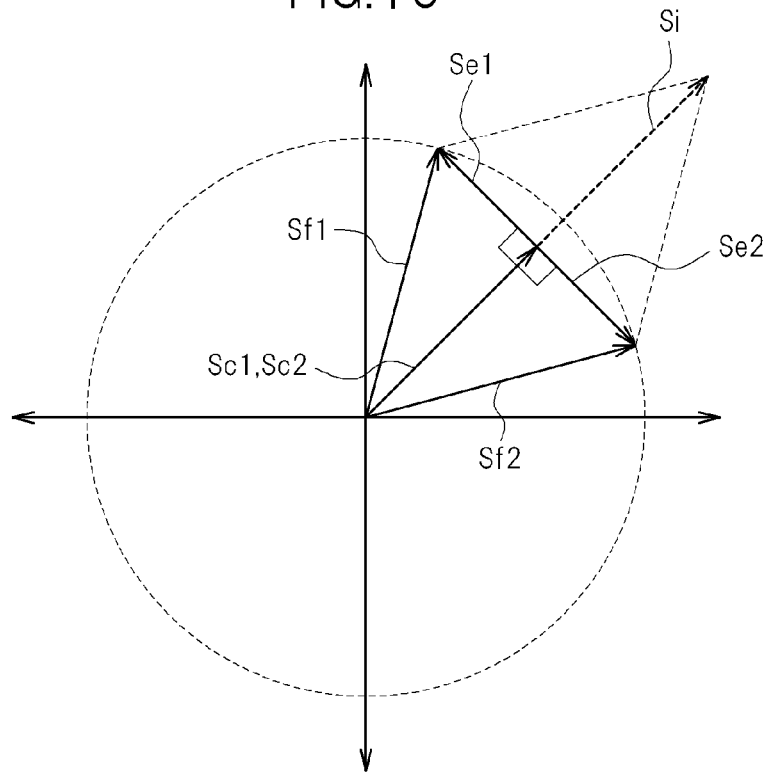
[FIG. 10] A diagram for describing the basic principle of generating constant envelope signals from an input signal with envelope variation.
Figure 11:
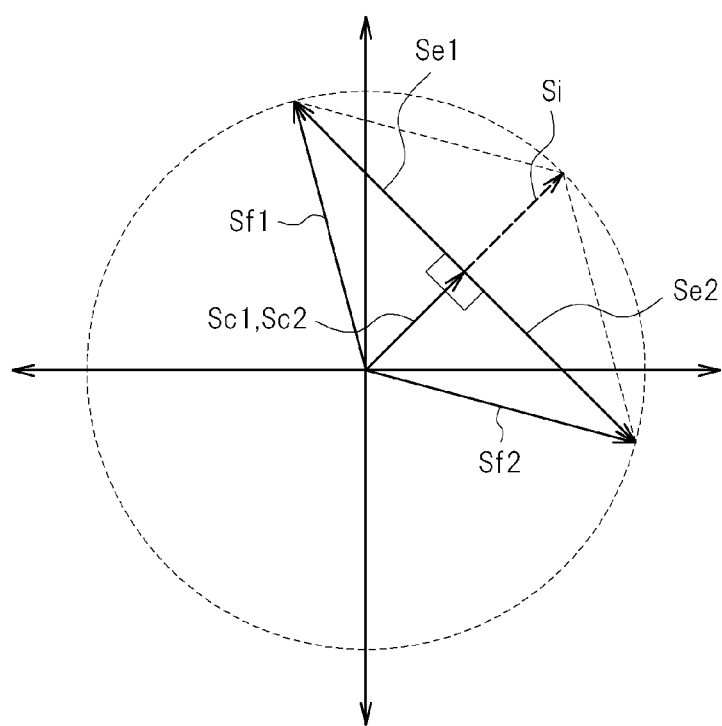
[FIG. 11] A diagram for describing the basic principle of generating the constant envelope signals from the input signal with envelope variation.

Now, referring to FIGS. 10 and 11, the basic principle of generating the constant envelope signals Sf1 and Sf2 from the input signal Si with envelope variation is described. FIGS. 10 and 11 are diagrams in which the relationships among the input signal Si, the fundamental signals Sc1 and Sc2, the converted signals Se1 and Se2, and the constant envelope signals Sf1 and Sf2 are represented by vector. Note that, for simple description, the amplitude of the fundamental signals Sc1 and Sc2 is set to ½ of the amplitude of the input signal Si, and the phase of the fundamental signals Sc1 and Sc2 is set the same as the phase of the input signal Si.

The input signal Si is distributed into the fundamental signals Sc1 and Sc2 having the same amplitude and the same phase. Then, as illustrated in FIG. 10, the constant envelope signal Sf1 is generated by vector addition of the fundamental signal Sc1 and the converted signal Se1, which is advanced in phase by $\pi/2$ relative to the fundamental signal So1. Further, the constant envelope signal Sf2 is generated by vector addition of the fundamental signal Sc2 and the converted signal Se2, which is delayed in phase by $\pi/2$ relative to the fundamental signal Sc2. Here, when the amplitude of the fundamental signals Sc1 and Sc2 is X, the amplitude of the converted signals Se1 and Se2 is Y, and the amplitude of the constant envelope signals Sf1 and Sf2 is B, the relationship of $X^2+Y^2=B^2$ is satisfied thereamong.

If the amplitude of the input signal Si changes to change the amplitude X of the fundamental signals Sc1 and Sc2, the amplitude Y of the converted signals Se1 and Se2 is changed so as to satisfy the relationship of $X^2+Y^2=A^2$ (A: any constant amplitude larger than X). For example, as illustrated in FIG. 11, if the amplitude of the input signal Si reduces to reduce the amplitude X of the fundamental signals Sc1 and Sc2, the amplitude Y of the converted signals Se1 and Se2 is increased so as to satisfy $Y^2=A^2-X^2$. As a result, the amplitude B of the constant envelope signals Sf1 and Sf2 is maintained at the constant amplitude A, and the constant envelope signals Sf1 and Sf2 become constant envelope signals having the constant amplitude, as their names suggest.

In the constant envelope signal generation circuit 510, in the above-mentioned manner, the input signal Si with envelope variation is converted into two constant envelope signals Sf1 and Sf2. Note that, it is apparent from FIGS. 10 and 11 that the original input signal Si with envelope variation should be obtained by vector addition of the constant envelope signals Sf1 and Sf2.

As illustrated in FIG. 9, the converted signal generation circuit 520 includes a phase shift circuit 530 and a conversion fundamental signal amplifier circuit 540.

The phase shift circuit 530 changes the phase of the conversion fundamental signal Sd so as to generate the converted signal Se1, which is advanced in phase by π/2 relative to the fundamental signal Sc1, and the converted signal Se2, which is delayed in phase by π/2 relative to the fundamental signal Sc2. The conversion fundamental signal Sd is advanced in phase by π/2 by a phase shifter 532 constituting part of the phase shift circuit 530, and is thereafter amplified by a variable-gain amplifier 544. After that, the conversion fundamental signal Sd is divided into two, one of which is input to the adder 100e as the converted signal Se1, and the other of which is input to the adder 100f as the converted signal Se2 after being advanced in phase by π by a phase shifter 534 constituting part of the phase shift circuit 530.

The conversion fundamental signal amplifier circuit 540 amplifies the conversion fundamental signal Sd based on the amplitude X of the fundamental signals Sc1 and Sc2 so that the amplitude Y of the converted signals Se1 and Se2 may satisfy $Y^2=A^2-X^2$. As illustrated in FIG. 9, the conversion fundamental signal amplifier circuit 540 includes an amplitude detection signal generation circuit 550, a subtractor 542, and the variable-gain amplifier 544.

The amplitude detection signal generation circuit 550 generates an amplitude detection signal Sg having a DC voltage a that is proportional to the amplitude of the constant envelope signals Sf1 and Sf2. The constant envelope signal Sf1 output from the adder 100e is input to the amplifier 506a, but before that, the constant envelope signal Sf1 is branched in part and further divided into two to be input to a mixer 552a. From the mixer 552a, a signal having a DC voltage component that is proportional to the amplitude of the constant envelope signal Sf1 is output, which is then input to an adder 554. Similarly, the constant envelope signal Sf2 output from the adder 100f is input to the amplifier 506b, but before that, the constant envelope signal Sf2 is branched in part and further divided into two to be input to a mixer 552b. From the mixer 552b, a signal having a DC voltage component that is proportional to the amplitude of the constant envelope signal Sf2 is output, which is then input to the adder 554. In the adder 554, the signal having the DC voltage component that is proportional to the amplitude of the constant envelope signal Sf1 and the signal having the DC voltage component that is proportional to the amplitude of the constant envelope signal Sf2 are added together, and the resultant is output to the subtractor 542 as the amplitude detection signal Sg.

The subtractor 542 receives a reference signal Sh having any DC voltage β larger than the DC voltage α, and the amplitude detection signal Sg. The subtractor 542 outputs a signal having a DC voltage γ satisfying γ=β−α to a low pass filter 546. The low pass filter 546 attenuates high frequency components including a frequency twice the frequency of the constant envelope signals Sf1 and Sf2. Then, an output signal composed mostly of DC voltage components is input to a buffer amplifier 548. The buffer amplifier 548 outputs a signal obtained by amplifying the input signal to the variable-gain amplifier 544 as a gain control signal Sj.

The variable-gain amplifier 544 amplifies the conversion fundamental signal Sd based on the gain control signal Sj so that the amplitude Y of the converted signals Se1 and Se2 may satisfy $Y^2=A^2-X^2$.

In this way, the DC voltage component of the gain control signal Sj, which varies inversely as the amplitude of the constant envelope signals Sf1 and Sf2 varies, is applied to the variable-gain amplifier 544 as a bias voltage. Therefore, the gain of the variable-gain amplifier 544 is varied inversely as the amplitude of the constant envelope signals Sf1 and Sf2 varies. As a result, the amplitude of the converted signals Se1 and Se2, which are generated by amplifying the conversion fundamental signal Sd in the variable-gain amplifier 544, also varies inversely as the amplitude of the constant envelope signals Sf1 and Sf2 varies. With the formation of this kind of feedback circuit, the amplitude of the constant envelope signals Sf1 and Sf2 is maintained constant, resulting in literally constant envelope signals.

According to the power amplifier 500 of the fifth embodiment, by using the adder 100 according to the first embodiment, a power amplifier that performs power amplification of high frequency signals by vector addition of a plurality of high frequency signals is implemented.

Note that, in the power amplifier 500, the signals to be amplified by the amplifiers 506a and 506b are constant envelope signals, and hence non-linear amplifiers having high power-added efficiency can be employed as the amplifiers 506a and 506b.

Further, the power amplifier 500 generates the constant envelope signals Sf1 and Sf2 without performing complicated calculation but performing simple calculation of vector addition of the fundamental signal Sc1 and the converted signal Se1 and vector addition of the fundamental signal Sc2 and the converted signal Se2. Therefore, the constant envelope signal generation circuit 510 can be constituted by a simple analog circuit having low power consumption. As a result, the overall power consumption of the power amplifier 500 can be reduced to increase the power-added efficiency of the power amplifier 500 as a whole.

[Sixth Embodiment]

Figure 12:
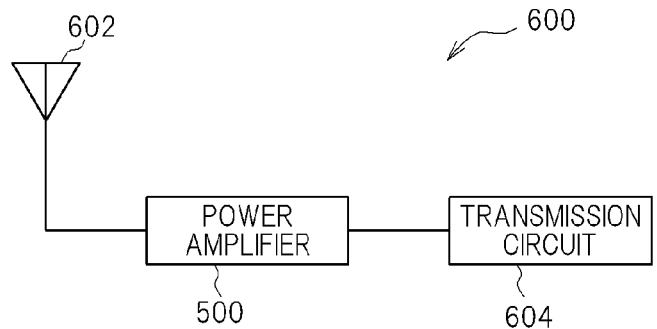
[FIG. 12] A block diagram schematically illustrating an example of a transmitter according to a sixth embodiment.

By using the adder 100 according to the first embodiment to constitute a transmitter, it is possible to implement a transmitter that performs transmission by vector addition of a plurality of high frequency signals. Here, as an example of using the adder 100 according to the first embodiment to constitute a transmitter, an example of using the power amplifier 500 according to the fifth embodiment to constitute a transmitter is described. FIG. 12 is a block diagram schematically illustrating the example of using the power amplifier 500 according to the fifth embodiment to constitute a transmitter. In a transmitter 600 according to a sixth embodiment, an antenna 602 is connected to a transmission circuit 604 via the power amplifier 500. Note that, in the transmitter 600 according to the sixth embodiment, the power amplifier 500 of low power consumption and high power-added efficiency is used to amplify a transmission signal with envelope variation, and hence it is possible to obtain a transmitter capable of long-term transmission with low power consumption.

[Seventh Embodiment]

Figure 13:
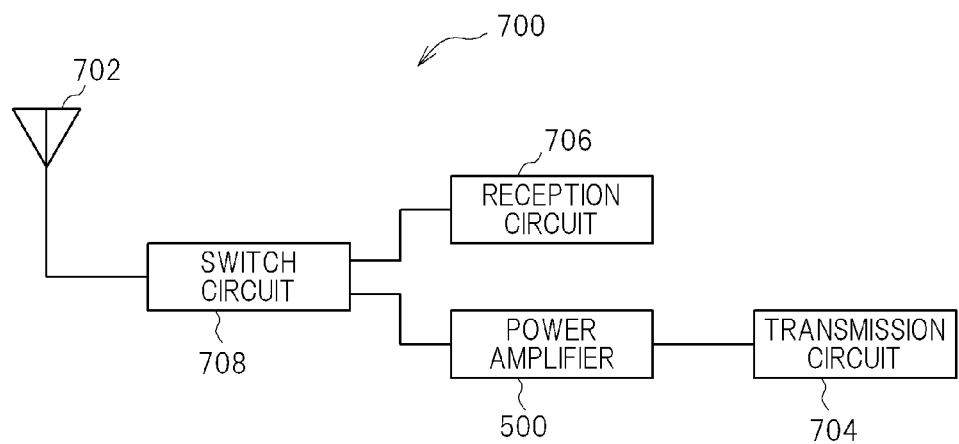
[FIG. 13] A block diagram schematically illustrating an example of a wireless communicator according to a seventh embodiment.

By using the adder 100 according to the first embodiment to constitute a wireless communicator, it is possible to implement a wireless communicator that performs wireless communication by vector addition of a plurality of high frequency signals. As an example of using the adder 100 according to the first embodiment to constitute a wireless communicator, an example of using the power amplifier 500 according to the fifth embodiment to constitute a wireless communicator is described. FIG. 13 is a block diagram schematically illustrating the example of using the power amplifier 500 according to the fifth embodiment to constitute a wireless communicator. In a wireless communicator 700 according to a seventh embodiment, an antenna 702 is connected to a transmission circuit 704 via the power amplifier 500, and a reception circuit 706 is connected to the antenna 702. Further, a switch circuit 708 for switching between transmission and reception is interposed between the antenna 702 and each of the transmission circuit 704 and the reception circuit 706. Note that, in the wireless communicator 700 according to the seventh embodiment, the power amplifier 500 of low power consumption and high power-added efficiency is used to amplify a transmission signal with envelope variation, and hence it is possible to obtain a wireless communicator capable of long-term communication with low power consumption.

MODIFIED EXAMPLE

The present invention is not limited to the above-mentioned first to seventh embodiments, and various modifications and improvements can be made thereto within the scope not departing from the gist of the present invention.

For example, the adder 100 according to the first embodiment or the adder 200 according to the second embodiment can be used to constitute various circuits.

The invention claimed is:

1. An adder, comprising:
a plurality of input terminals;
an output terminal;
a plurality of first impedance circuits connected in parallel, each including one end connected to corresponding one of the plurality of input terminals and the other end connected to a common output;
a second impedance circuit including one end configured to connect to a power supply;
a transistor circuit including a drain terminal connected to the other end of the second impedance circuit; and
a third impedance circuit including one end connected to a source terminal of the transistor circuit and the other end connected to a first circuit through which a substantially constant current flows,
wherein the plurality of first impedance circuits have a common output point which is directly or indirectly connected to a first connection point on a line between the source terminal of the transistor circuit and the one end of the third impedance circuit,
wherein the output terminal is directly or indirectly connected to a second connection point on a line between the other end of the second impedance circuit and the drain terminal of the transistor circuit,
wherein impedances seen from the common output point of the plurality of first impedance circuits toward the respective plurality of input terminals are set so that high frequency currents flowing from the common output point of the plurality of first impedance circuits toward the respective plurality of input terminals are approximately zero,
wherein an impedance seen from the first connection point toward the plurality of input terminals is set so that a high frequency current flowing from the first connection point toward the plurality of input terminals is approximately zero,
wherein an impedance seen from the first connection point toward the first circuit flows is set so that a high frequency current flowing from the first connection point toward the first circuit is approximately zero, and
wherein an impedance seen from the second connection point toward the power supply is set so that a high frequency current flowing from the second connection point toward the power supply is approximately zero.

2. An adder, comprising:
a plurality of input terminals;
an output terminal;
a plurality of first impedance circuits connected in parallel, each including one end connected to corresponding one of the plurality of input terminals and the other end connected to a common output;
a second impedance circuit including one end configured to connect to a power supply;
a transistor circuit including a drain terminal connected to the other end of the second impedance circuit; and
a third impedance circuit including one end connected to a source terminal of the transistor circuit and the other end connected to a first circuit through which a substantially constant current flows,
wherein the plurality of first impedance circuits have a common output point which is directly or indirectly connected to a first connection point on a line between the source terminal of the transistor circuit and the one end of the third impedance circuit,
wherein the output terminal is directly or indirectly connected to a second connection point on a line between the other end of the second impedance circuit and the drain terminal of the transistor circuit, and
wherein impedances seen from the common output point of the plurality of first impedance circuits toward the respective input terminals, an impedance seen from the first connection point toward the plurality of input terminals, an impedance seen from the first connection point toward the first circuit, and an impedance seen from the second connection point toward the power supply are set so that an output signal output from the output terminal is within tolerance.

3. The adder according to claim 1, further comprising a first output terminal and a second output terminal,
wherein the first output terminal is directly or indirectly connected to the second connection point,
wherein the second output terminal is directly or indirectly connected to the first connection point, and
wherein a gate width of the transistor circuit and the impedance seen from the second connection point toward the power supply are set so that a first output signal from the first output terminal and a second output signal from the second output terminal have a phase difference of substantially $\pi/2$.

4. The adder according to claim 3,
wherein the second connection point and the drain terminal of the transistor circuit are connected via a filter circuit, and
wherein the gate width of the transistor circuit, the impedance seen from the second connection point toward the power supply, and the filter circuit are set so that the first output signal and the second output signal have the phase difference of substantially $\pi/2$.

5. A power combiner, comprising:
two power amplifiers for amplifying and outputting input signals; and
the adder according to claim 1 for adding output signals of the two power amplifiers, which are input to the adder, and outputting an added signal.

6. A quadrature modulator, comprising:
a first voltage-controlled oscillator for receiving an I signal to output a first output signal represented by $\cos((\omega c+\omega s)*t)$, and a second voltage-controlled oscillator for receiving the I signal to output a second output signal represented by $\cos((\omega c-\omega s)*t)$, where $\omega c$ is an angular frequency of a carrier wave and $\omega s$ is an angular frequency of a modulated signal which varies based on a level of the I signal;
a third voltage-controlled oscillator for receiving a Q signal to output a third output signal represented by $\cos((\omega c+\omega s)*t)$, and a fourth voltage-controlled oscillator for receiving the Q signal to output a fourth output signal represented by $\cos((\omega c-\omega s)*t)$, where $\omega c$ is an angular frequency of a carrier wave and $\omega s$ is an angular frequency of a modulated signal which varies based on a level of the Q signal;
a first adder according to claim 1 for adding the first output signal and the second output signal which are input to the first adder, and outputting a fifth output signal;
a second adder according to claim 1 for adding the third output signal and the fourth output signal which are input to the second adder, and outputting a sixth output signal; and
a third adder according to claim 1 for adding the fifth output signal and the sixth output signal which are input to the third adder, and outputting a seventh output signal.

7. A quadrature demodulator, comprising the adder according to claim 1,
wherein the quadrature demodulator performs quadrature demodulation by the adder adding a plurality of signals.

8. A power amplifier, comprising:
a constant envelope signal generation circuit for converting an input signal with envelope variation into a first constant envelope signal and a second constant envelope signal, to output the first constant envelope signal and the second constant envelope signal;
a first amplifier for amplifying the first constant envelope signal which is input to the first amplifier, and outputting a first amplified signal;
a second amplifier for amplifying the second constant envelope signal which is input to the second amplifier, and outputting a second amplified signal; and
the adder according to claim 1 for adding the first amplified signal and the second amplified signal which are input to the adder, and outputting an amplified output signal with envelop variation.

9. A transmitter, comprising:
a transmission circuit;
an antenna; and
the power amplifier according to claim 8,
wherein the antenna is connected to the transmission circuit via the power amplifier.

10. A wireless communicator, comprising:
a transmission circuit;
a reception circuit;
an antenna; and
the power amplifier according to claim 8,
wherein the antenna is connected to the transmission circuit via the power amplifier, and the reception circuit is connected to the antenna.

11. The adder according to claim 2, further comprising a first output terminal and a second output terminal,
wherein the first output terminal is directly or indirectly connected to the second connection point,
wherein the second output terminal is directly or indirectly connected to the first connection point, and
wherein a gate width of the transistor circuit and the impedance seen from the second connection point toward the power supply are set so that a first output signal from the first output terminal and a second output signal from the second output terminal have a phase difference of substantially $\pi/2$.

12. The adder according to claim 11,
wherein the second connection point and the drain terminal of the transistor circuit are connected via a filter circuit, and
wherein the gate width of the transistor circuit, the impedance seen from the second connection point toward the power supply, and the filter circuit are set so that the first output signal and the second output signal have the phase difference of substantially $\pi/2$.

13. A power combiner, comprising:
two power amplifiers for amplifying and outputting input signals; and
the adder according to claim 2 for adding output signals of the two power amplifiers, which are input to the adder, and outputting an added signal.

14. A quadrature modulator, comprising:
a first voltage-controlled oscillator for receiving an I signal to output a first output signal represented by $\cos((\omega c+\omega s)*t)$, and a second voltage-controlled oscillator for receiving the I signal to output a second output signal represented by $\cos((\omega c-\omega s)*t)$, where $\omega c$ is an angular frequency of a carrier wave and $\omega s$ is an angular frequency of a modulated signal which varies based on a level of the I signal;
a third voltage-controlled oscillator for receiving a Q signal to output a third output signal represented by $\cos((\omega c+\omega s)*t)$, and a fourth voltage-controlled oscillator for receiving the Q signal to output a fourth output signal represented by $\cos((\omega c-\omega s)*t)$, where $\omega c$ is an angular frequency of a carrier wave and $\omega s$ is an angular frequency of a modulated signal which varies based on a level of the Q signal;
a first adder according to claim 2 for adding the first output signal and the second output signal which are input to the first adder, and outputting a fifth output signal;
a second adder according to claim 2 for adding the third output signal and the fourth output signal which are input to the second adder, and outputting a sixth output signal; and
a third adder according to claim 2 for adding the fifth output signal and the sixth output signal which are input to the third adder, and outputting a seventh output signal.

15. A quadrature demodulator, comprising the adder according to claim 2,
wherein the quadrature demodulator performs quadrature demodulation by the adder adding a plurality of signals.

16. A power amplifier, comprising:
a constant envelope signal generation circuit for converting an input signal with envelope variation into a first constant envelope signal and a second constant envelope signal, to output the first constant envelope signal and the second constant envelope signal;
a first amplifier for amplifying the first constant envelope signal which is input to the first amplifier, and outputting a first amplified signal;

a second amplifier for amplifying the second constant envelope signal which is input to the second amplifier, and outputting a second amplified signal; and the adder according to claim 2 for adding the first amplified signal and the second amplified signal which are input to the adder, and outputting an amplified output signal with envelop variation.

17. A transmitter, comprising:

a transmission circuit;

an antenna; and the power amplifier according to claim 16, wherein the antenna is connected to the transmission circuit via the power amplifier.

18. A wireless communicator, comprising:

a transmission circuit;

a reception circuit;

an antenna; and the power amplifier according to claim 16, wherein the antenna is connected to the transmission circuit via the power amplifier, and the reception circuit is connected to the antenna.

* * * * *